(12) United States Patent
Kim et al.

(10) Patent No.: US 6,853,090 B2
(45) Date of Patent: Feb. 8, 2005

(54) TAB TAPE FOR SEMICONDUCTOR PACKAGE

(75) Inventors: Dong Han Kim, Osan (KR); Hyoung Ho Kim, Anyang (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 7 days.

(21) Appl. No.: 10/359,080

(22) Filed: Feb. 6, 2003

(65) Prior Publication Data

US 2003/0197200 A1 Oct. 23, 2003

(30) Foreign Application Priority Data

Apr. 16, 2002 (KR) ........................................ 2002-20682

(51) Int. Cl.[7] .............................................. H01L 29/40
(52) U.S. Cl. ........................ 257/784; 257/785; 257/786
(58) Field of Search ................................ 257/784–786, 257/775, 673

(56) References Cited

U.S. PATENT DOCUMENTS

| | | | |
|---|---|---|---|
| 5,343,366 A | * | 8/1994 | Cipolla et al. .............. 361/785 |
| 5,378,581 A | * | 1/1995 | Vernon ........................ 430/313 |
| 5,726,860 A | | 3/1998 | Mozdzen |
| 5,734,559 A | | 3/1998 | Banerjee et al. |
| 5,818,252 A | * | 10/1998 | Fullman et al. ............. 324/765 |
| 5,895,977 A | | 4/1999 | Banerjee |

FOREIGN PATENT DOCUMENTS

JP          05-251501          9/1993

\* cited by examiner

*Primary Examiner*—Dung A. Le
(74) *Attorney, Agent, or Firm*—Harness, Dickey & Pierce, P.L.C.

(57) ABSTRACT

A TAB tape for a semiconductor package is provided. The TAB tape provides number of test pad configuration for reducing the area of the test pad area on a TAB tape to increases the number of packages that may be prepared from a length of TAB tape. The TAB tape comprises a base film having a chip mounting area for mounting at least one semiconductor device and a wiring pattern formed on the base film with test pads formed at the ends of the output terminal patterns. A predetermined number of the test pads are arranged in rows form a group wherein the number of rows is less than the number of test pads in the group. Groups of the test pads are consecutively arranged across the TAB tape to provide the number of test pads necessary for testing the semiconductor device(s).

36 Claims, 8 Drawing Sheets

TAB TAPE FOR SEMICONDUCTOR PACKAGE

This application claims priority from Korean Patent Application No. 2002-20682, filed on Apr. 16, 2002, the contents of which are incorporated herein by reference in their entirety.

BACKGROUND OF THE INVENTION

1. Field of the Invention

The present invention relates to a tape automated bonding (TAB) tape for a semiconductor package such as a tape carrier package (TCP) and a chip on film (COF) and more particularly to test pad layout of the TAB tape.

2. Description of the Related Art

Tape automated bonding (TAB) was introduced as a replacement for a conventional wire bonding technology. TAB is now used for liquid crystal displays, watches, cameras, memory cards, calculators, personal computers and other electronic devices. TAB provides a high-density interconnect from IC chips to substrate, allowing full automation of the bonding of one end of the tape wiring pattern to the IC chips and the other end of the tape wiring pattern to the substrate.

Figure 1:
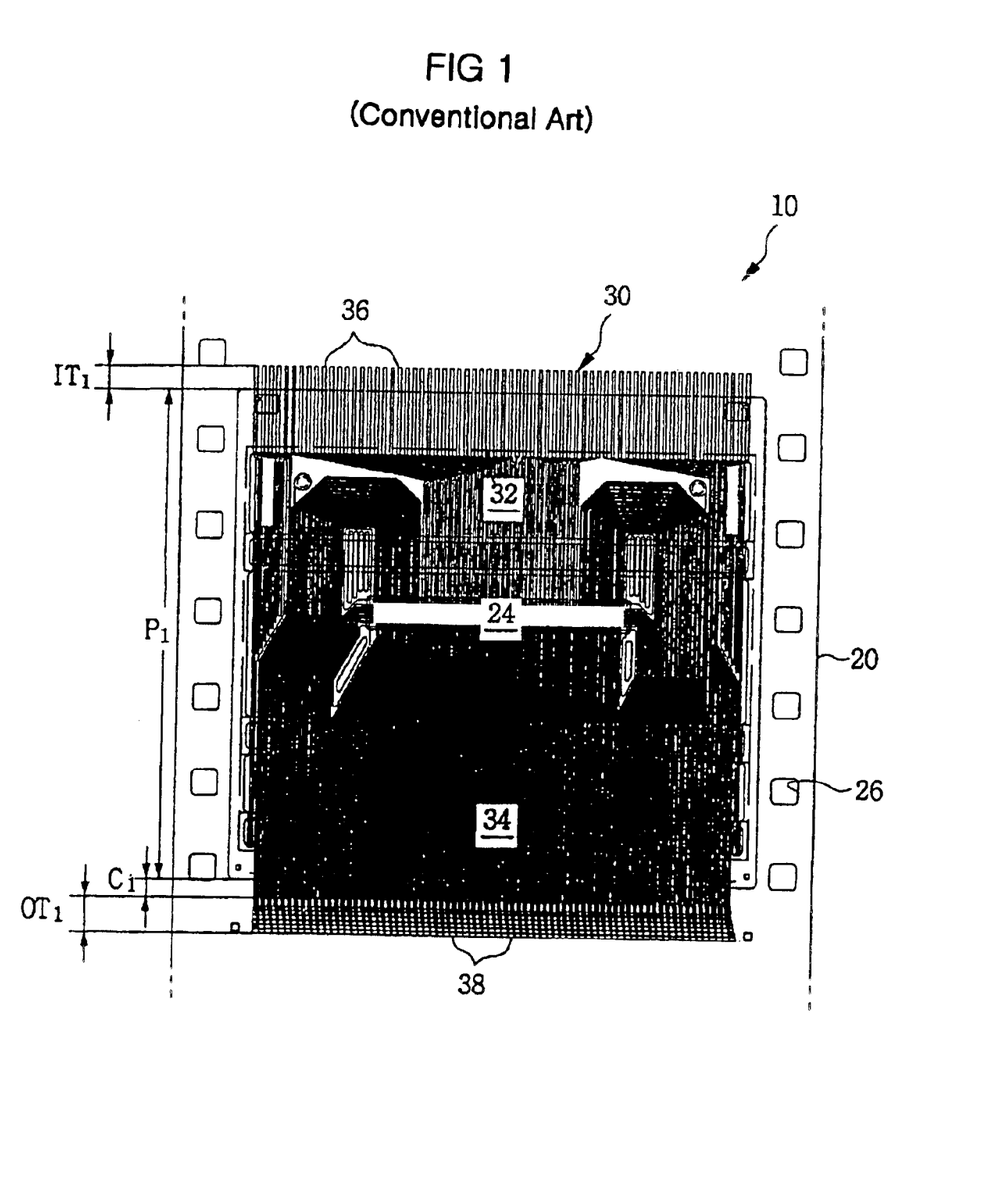
FIG. 1 is a plan view of a conventional TAB tape for a semiconductor package.

FIG. 1 shows a conventional TAB tape 10. A wiring pattern 30 is formed on a base film 20. The base film 20 has a window 24, typically formed near the center, through which the semiconductor IC chip is connected to the wiring pattern 30 by inner lead bonding (ILB). Sprocket holes 26 are formed on each edge of the base film 20 at regular intervals. The wiring pattern 30 also typically includes input terminal patterns 32 extending in one direction from the window 24 and output terminal patterns 34 extending in the opposite direction from the window 24. Test pads 36 and 38 are provided at the ends of the input/output terminal patterns 32 and 34, respectively. The input terminal patterns 32 and output terminal patterns 34 are generally parallel to the rows of sprocket holes 26. For clarity, the test pads 36 formed at the ends of the input terminal patterns 32 are hereinafter described as input test pads. Likewise, the test pads 38 formed at the ends of the output terminal patterns 34 are hereinafter described as output test pads.

The TAB tape 10 comprises a package area P1 substantially comprising that portion of the tape that will be included in the final packaged product, input test pad area IT1 and output test pad area OT1 formed at opposite ends of the package area P1 and a cutting area C1 for separating the package area P1 from the output test pad area OT1. The input test pad area IT1 contains the input test pads 36 and an output test pad area OT1 contains the test pads 38. Depending on the particular TAB tape configuration other cutting areas (not illustrated) may be provided for separating the package area P1 from other portions of the TAB tape such as the edge portions containing the sprocket holes 26 and the input test pad area IT1.

Figure 2:
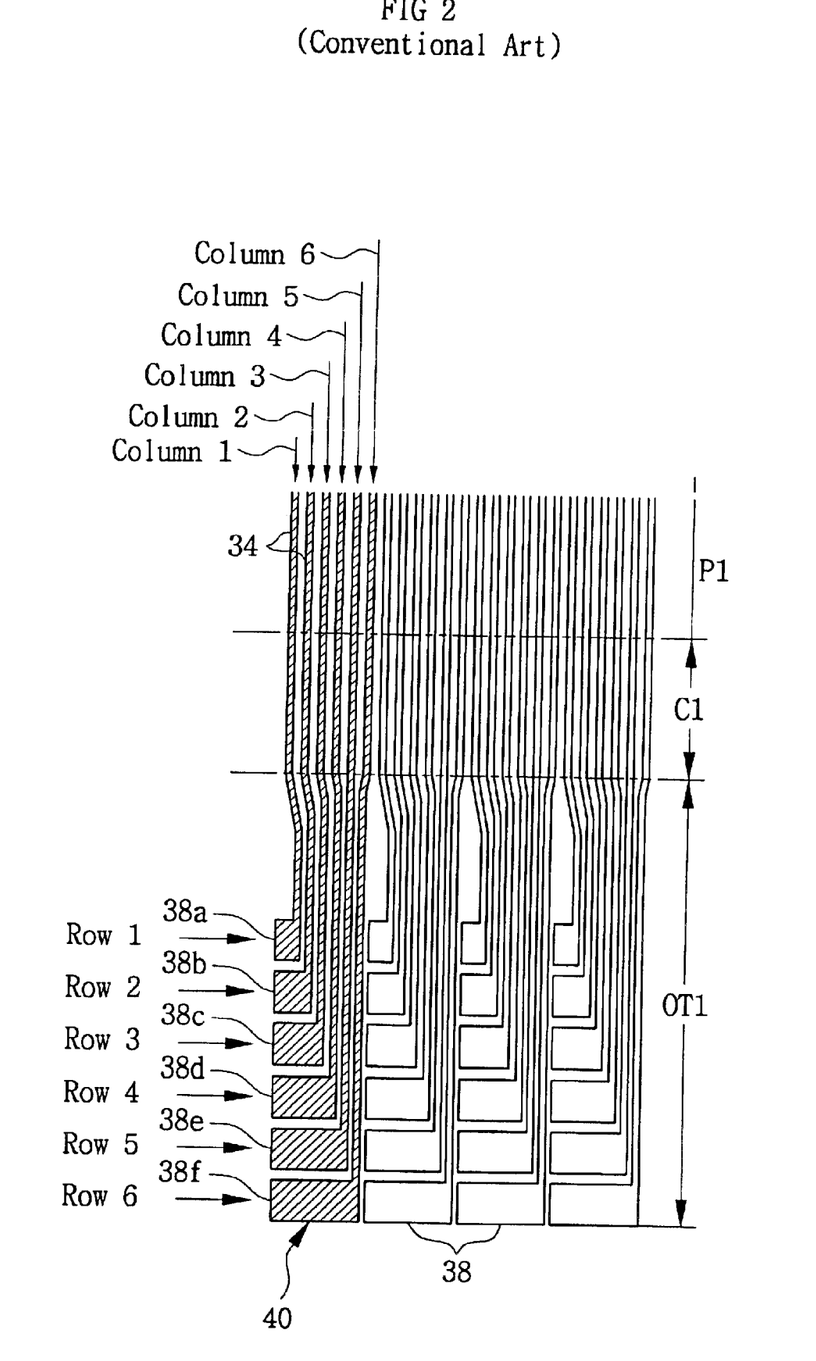
FIG. 2 is an enlarged plan view of an test pad area shown in FIG. 1.

Referring to FIG. 2, each of the output terminal patterns 34 connects to a corresponding test pad. The output test pads 38 are arranged a series of groups 40 arranged across the tape 10 at regular intervals. FIG. 2 illustrates the layout of six output test pads 38a–38f that form one group 40. As illustrated, the output test pads 38a–38f are arranged in six rows, with a single output test pad in each row corresponding to a single line of the output terminal pattern.

Although the conventional TAB tape 10 may provide certain advantages for easily manufacturing test devices, the output test pad area OT1 occupies a large portion of the base film 20. The area consumed by the output test pad area OT1 reduces the number of semiconductor packages that may be formed from a length of TAB tape and increases the overall cost of the package.

SUMMARY OF THE INVENTION

In an exemplary embodiment, the present invention is directed to a TAB tape for a semiconductor package having an enhanced output test pad layout.

In an exemplary embodiment, the present invention is directed to a TAB tape for a semiconductor package which reduces the output test pad area and thus increases the yield of the semiconductor packages per length of TAB tape.

In an exemplary embodiment, the present invention is directed to a TAB tape for semiconductor packaging comprising a base film having a chip mounting area for mounting at least one semiconductor chip and a wiring pattern having test pads, typically input and/or output test pads, formed at the ends of the wiring patterns.

In an exemplary embodiment, the output test pads may be arranged in a series of rows with a desired or given number of the output test pads forming a group. Each group of output test pads includes at least one row having at least two output test pads therein.

In accord with an exemplary embodiment of the present invention, six output test pads, each connected to one of six lines, form a group and are arranged in three rows with the output test pad for lines 1, 5 and 6 adjoining each other in a single row.

In accord with another exemplary embodiment of the present invention, six output test pads form a group and may be arranged in four rows with the output test pads for lines 3 and 6 adjacent each other and symmetric with respect to the lines connected to the output test pads for lines 4 and 5.

In accord with another exemplary embodiment of the present invention, five output test pads form a group and may be arranged in three rows with the output test pad for line 3 adjacent the output test pad for line 4 and the output test pads for lines 2 and 5 being symmetric with respect to the output terminal patterns connected to the output test pads for lines 3 and 4.

In accord with another exemplary embodiment of the present invention, four output test pads form a group and are located in three rows with the output test pads for lines 2 and 4 in the same row and symmetric with respect to the line connected to the output test pad for line 3.

In accord with another exemplary embodiment of the present invention, four output test pads form a group and are located in three rows with the output test pad for line 2 adjacent the output test pad for line 3 in the third row.

BRIEF DESCRIPTION OF THE DRAWINGS

The present invention will be readily understood with reference to the following detailed description of exemplary embodiments provided in conjunction with the accompanying drawings, wherein like reference numerals designate like structural elements, and, in which.

DESCRIPTION OF THE PREFERRED EMBODIMENTS

Preferred embodiments of the present invention will be described below with reference to the accompanying drawings.

Figure 3:
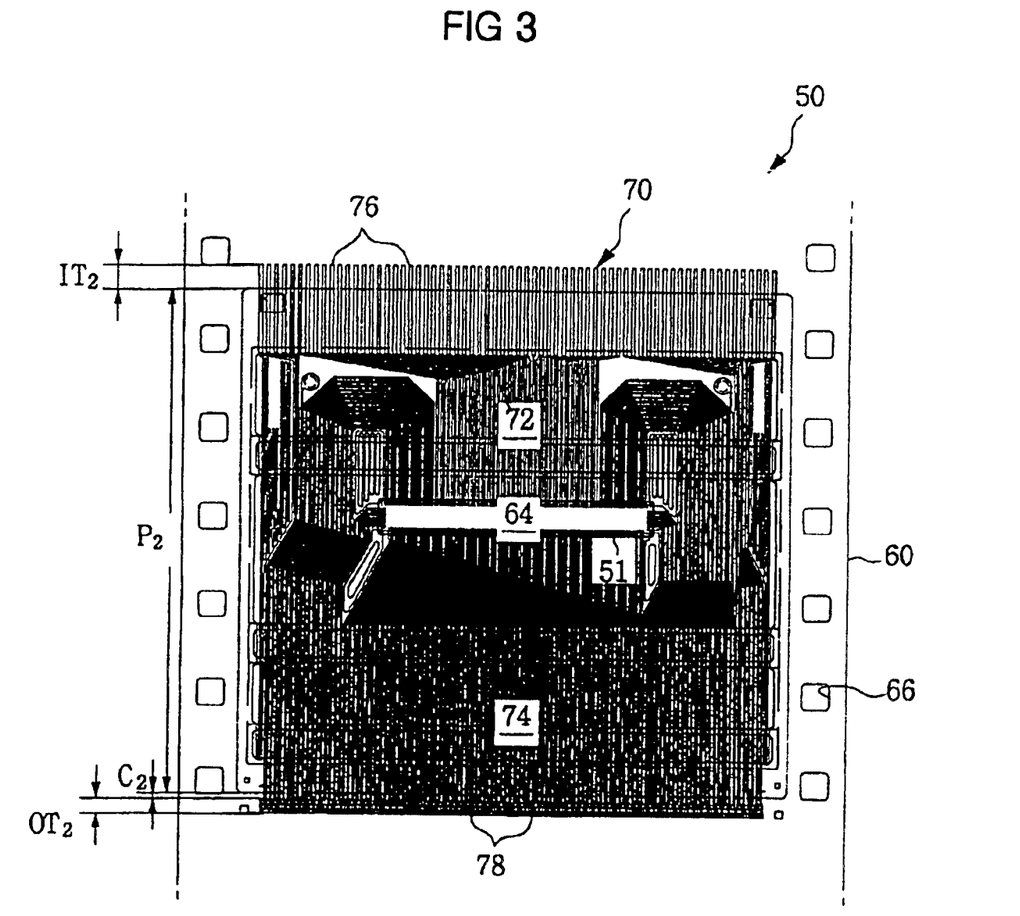
FIG. 3 is a plan view of a TAB tape for a semiconductor package in accordance with an exemplary embodiment of the present invention.
Figure 4:
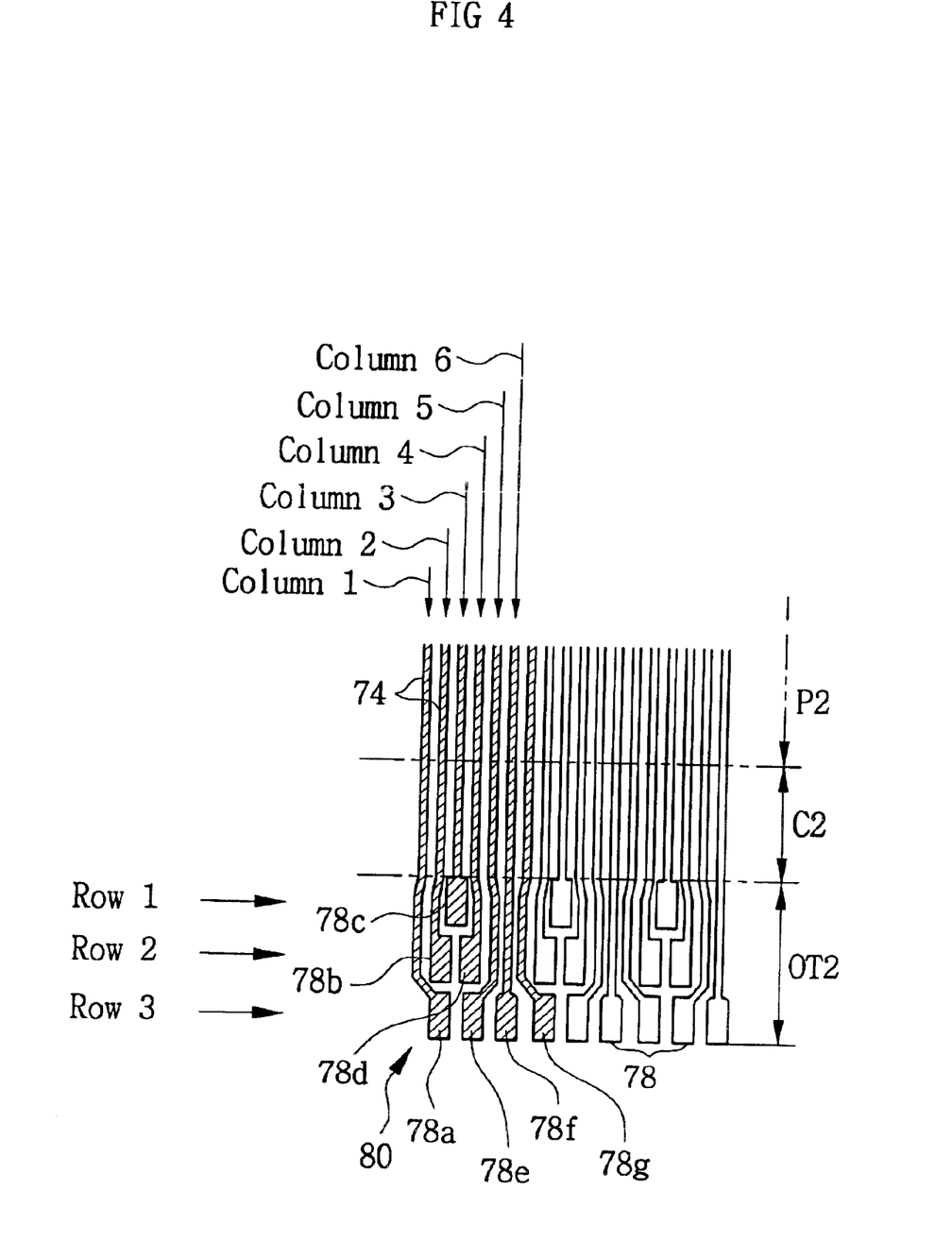
FIG. 4 is an enlarged plan view illustrating layout of output test pads of the TAB tape shown in FIG. 3.

As illustrated in FIGS. 3 and 4, an exemplary embodiment of the present invention comprises a TAB tape 50 for semiconductor packaging having a reduced test pad area OT2. The TAB tape 50 comprises a base film 60, typically a polyimide or other suitable polymer, upon which is provided a wiring pattern 70, typically copper or other metallic conductor. The TAB tape 50 comprises a package area P2 configured to receive and mount at least one semiconductor device and input/output test pad areas IT2 and OT2 formed at opposite ends of the package area P2. A cutting area C2 is provided for separating the package area P2 from the output test pad area OT2, after which the output test pad area OT2 may be discarded. The TAB tape 50 may be quite long and may comprise a series of package areas P2 wound on a reel for substantially continuous sequential manufacture of numerous packages from a single tape. The portion of TAB tape 50 shown in FIG. 3 may be a portion of a much longer tape allotted to one semiconductor package.

The package area P2 includes a chip mounting area 51, input terminal patterns 72 extending in a first direction from the chip mounting area 51 and output terminal patterns 74 extending in the opposite direction from the chip mounting area 51. The chip mounting area 51 has a window 64 penetrating the base film 60. The semiconductor chip (not shown) is connected to the wiring pattern 70 through the window 64 by inner lead bonding (ILB).

The input test pad area IT2 has input test pads 76 connected to the ends of the input terminal patterns 72. The output test pad area OT2 has output test pads 78 connected to the ends of the output terminal patterns 74. The output terminal patterns 74 extend across the cutting area C2 to reach the output test pads. The output test pads 78 may be wider than the output terminal patterns 74 to reduce the precision required for placing the test pins or probes of a test device in contact with the test pads.

Sprocket holes 66 may be formed along each edge of the base film 60 at regular intervals. The sprocket holes 66 assist in both aligning the package area P2 and indexing a longer TAB tape 50 as it is unwound from a reel for the sequential application of semiconductor devices to the tape in a continuous manufacturing process.

In accordance with the present invention, a predetermined number of the output test pads 78 form a group 80. The output test pad groups 80 are consecutively arranged across the TAB tape 50 in a repeating fashion and each group includes at least one row having at least two output test pads 78.

Therefore, the layout of the output test pads 78 forming each group 80 according to the present invention allows the size of the output test pad area OT2 to be reduced. This reduction in the size of the output test pad area OT2 results from the fact that, unlike the conventional configuration illustrated in FIG. 2 in which the size of the output test pads 38 becomes increasingly larger with each lower row, the size of at least some of the output test pads 78 may be reduced, and preferably standardized, in accord the applicable design rules for metal pattern 70, thereby allowing at least two output test pads 78 to be provided in a single row. This reduction in the output test pad area OT2, in turn, increases the proportion of the area of the TAB tape that may be dedicated to mounting semiconductor devices, thereby increasing the yield and reducing the packaging costs. Preferably, the size of each output test pad 78 is the maximum size allowed by the design rules while maintaining the spacing necessary to avoid interference between adjacent output test pads 78 or an output test pad 78 and adjacent output terminal patterns or lines 74. Accordingly, the present invention provides a TAB tape having a reduced test pad area by modifying the layout of the test pad.

As illustrated in FIG. 4, in accordance with an exemplary embodiment of the present invention, six output test pads 78a–78f form a group 80. A series of repeating groups 80 are arranged across the TAB tape to provide an test pad for each output terminal pattern 74. Preferably, the group 80 is selected as a minimum unit of the repeated configuration of the output test pads 78. The six output test pads 78a–78f comprising the group 80 are arranged at positions 1×3 (78a), 2×2 (78b), 3×1 (78c), 4×2 (78d), 5×3 (78e) and 6×3 (78f), respectively. The reported position "i×j" for each output test pad represents its location within the group as the $i^{th}$ column (or connected to the $i^{th}$ output terminal pattern) and the $j^{th}$ row. In this exemplary embodiment, the output test pad for column 2 (78b) is positioned adjacent the output test pad for column 4 (78d) in the second row. Similarly, the output test pads for columns 1 (78a), 5 (78e) and 6 (78f) adjoin each other in the third row. In this exemplary embodiment, each of the output test pads 78a–78f is approximately the same size, the size being the minimum size permitted under the applicable design rules.

As will be appreciated, a TAB tape 50 configured according to this exemplary embodiment of the present invention may reduce the test pad area OT2 by as much as three rows (about 50%) when compared with test pad area OT1 provided on the conventional TAB tape 10 shown in FIGS. 1 and 2. Specifically, in the case of a TAB tape for a 509-pin TCP (comprising 65 input terminals and 444 output terminals), configuring the output test pads according to the this embodiment of the present invention saves approximately 4 mm of TAB tape length for each package area.

Because the output test pads 78 are consecutively arranged, it would be obvious that a person of ordinary skill in the art may easily arrange the output test pads 78 so as to form a new group configuration without changing the order of the output test pads 78 in the above described group 80 by simply indexing across the output test pad positions. For example, a first alternative configuration may be formed by removing the output test pad for the first column (78a) and incorporating the output test pad for column 7 (78g) to form a new six-column group having output test pads 78b–78g located at positions 2×2 (78b), 3×1 (78c), 4×2 (78d), 5×3 (78e), 6×3 (78f) and 7×3 (78g). Thus, as illustrated in FIG. 4, this exemplary embodiment incorporates five alternative output test pad groups depending upon which of the output test pads 78b–78f is treated as the "first" output test pad of the group. Therefore, if there are n (n being a positive integer) test pads in a certain group configuration, then n−1 alternative grouping of the test pads may be possible. Further, as long as the position of test pins or probes is controlled in conformity to the configuration of the group 80, a conventional test device may be used for testing the semiconductor devices mounted on TAB tape 50.

Figure 5:
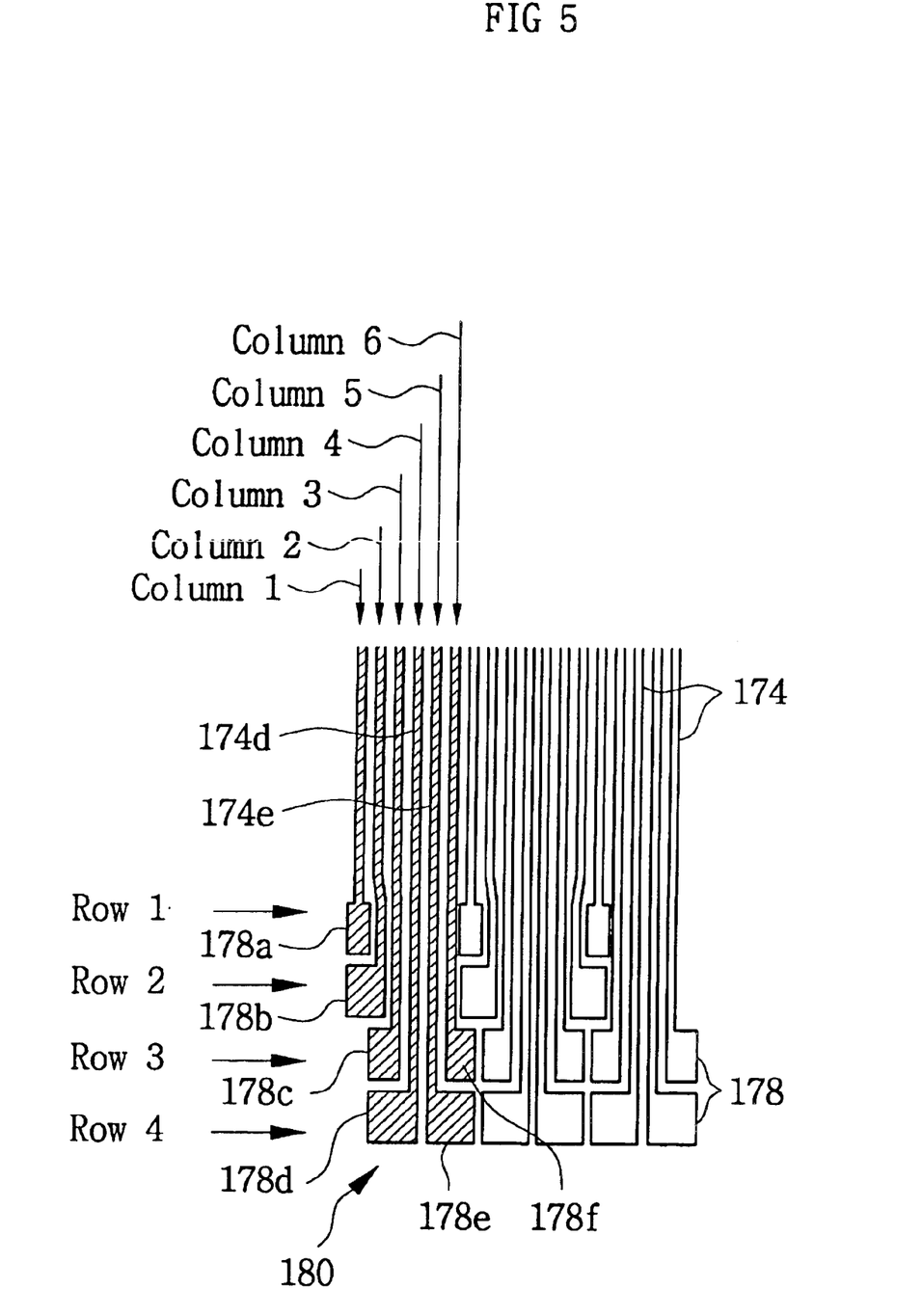
FIG. 5 is an enlarged plan view illustrating layout of output test pads of the TAB tape in accordance with another exemplary embodiment of the present invention.

Referring to FIG. 5, in accordance with another exemplary embodiment of the present invention, six test pads 178a–178f form a group 180. A series of groups 180 may be consecutively arranged across the TAB tape. The six test pads 178a–178f comprising group 180 are located at positions 1×1 (178a), 2×2 (178b), 3×3 (178c), 4×4 (178d), 5×4 (178e) and 6×3 (178f), respectively. The test pads for the third column (178c) and the sixth column (178f) are symmetrical with respect to the output terminal patterns (174d and 174e) connected to the test pads for the fourth column (178d) and fifth column (178e), respectively. The test pad for the fourth column (178d) is adjacent to the test pad for the fifth column (178e) in the fourth row. The third row has two test pads for the third column (178c) and fourth column (178f).

A TAB tape configured according to this exemplary embodiment may reduce the length of the test pad area OT2 by at least two rows, compared with the test pad area OT1 according to a conventional TAB tape 10 as shown in FIGS. 1 and 2.

In accord with this exemplary embodiment, the output test pads (178a, 178c and 178f) in the first and third rows may be formed to the minimum size allowed by the applicable design rules and the output test pads (178b, 178d and 178f) in the second and fourth rows may be formed to the maximum size allowed by the design rules while providing the required spacing between the output terminal patterns 174 and the output test pads 178. And as with the previous exemplary embodiment illustrated in FIG. 4, the output test pads of the embodiment of FIG. 5 illustrates five alternative groupings made possible by selecting an output test pad 178b–178f other than output test pad 178a as the "first" output test pad of a particular group.

Figure 6:
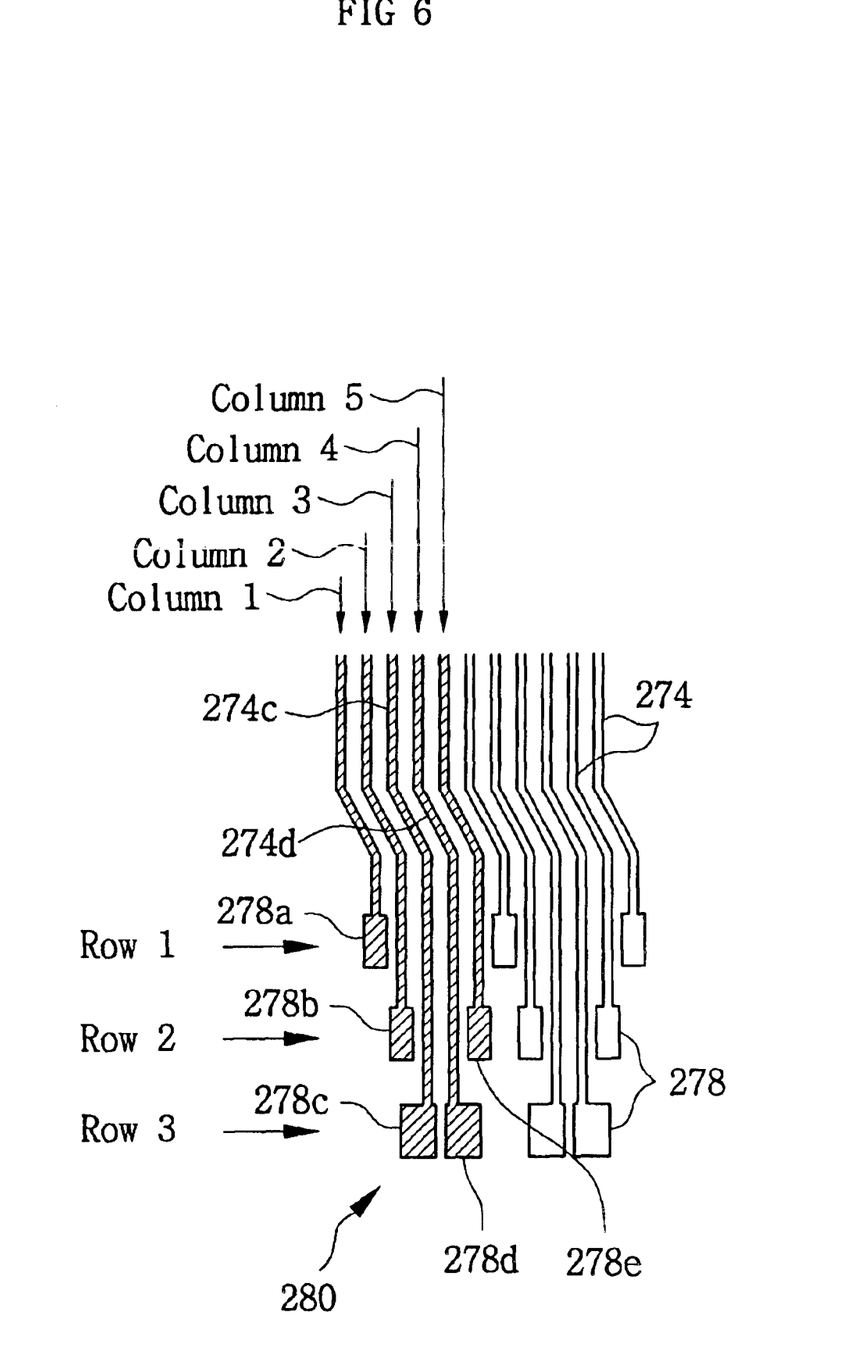
FIG. 6 is an enlarged plan view illustrating layout of output test pads of a TAB tape in accordance with another exemplary embodiment of the present invention.

Referring to FIG. 6, in accordance with another exemplary embodiment of the present invention, five output test pads 278a–278e form a group 280. A series of groups 280 may be consecutively arranged across the TAB tape 50. The five output test pads 278a–278e comprising group 280 may be located at positions 1×1 (278a), 2×2 (278b), 3×3 (278c), 4×3 (278d) and 5×2 (178e), respectively. The output test pads for the second column (278b) and the fifth column (278e) may be arranged symmetrically with respect to the output terminal patterns (274c and 274d) connected to the output test pads for the third column (278c) and fourth column (278d), respectively. The output test pad for the third column (278c) may be adjacent to the output test pad for the fourth column (278d) in the third row. A second row may include two test pads (278b and 278e) separated by output terminal patterns.

A TAB tape configured according to this embodiment may reduce the length of the test pad area by as much as two rows, compared with the test pad area OT1 provided by conventional TAB tape 10 as shown in FIGS. 1 and 2.

The output test pads (278a, 278b and 278e) in the first and second row may be formed at a minimum size allowed by the design rules and the output test pads (278c, and 278d) in the third row may be formed at a maximum size allowed by the design rules while providing the required spacing between the output terminal patterns 274 and the output test pads 278.

Figure 7:
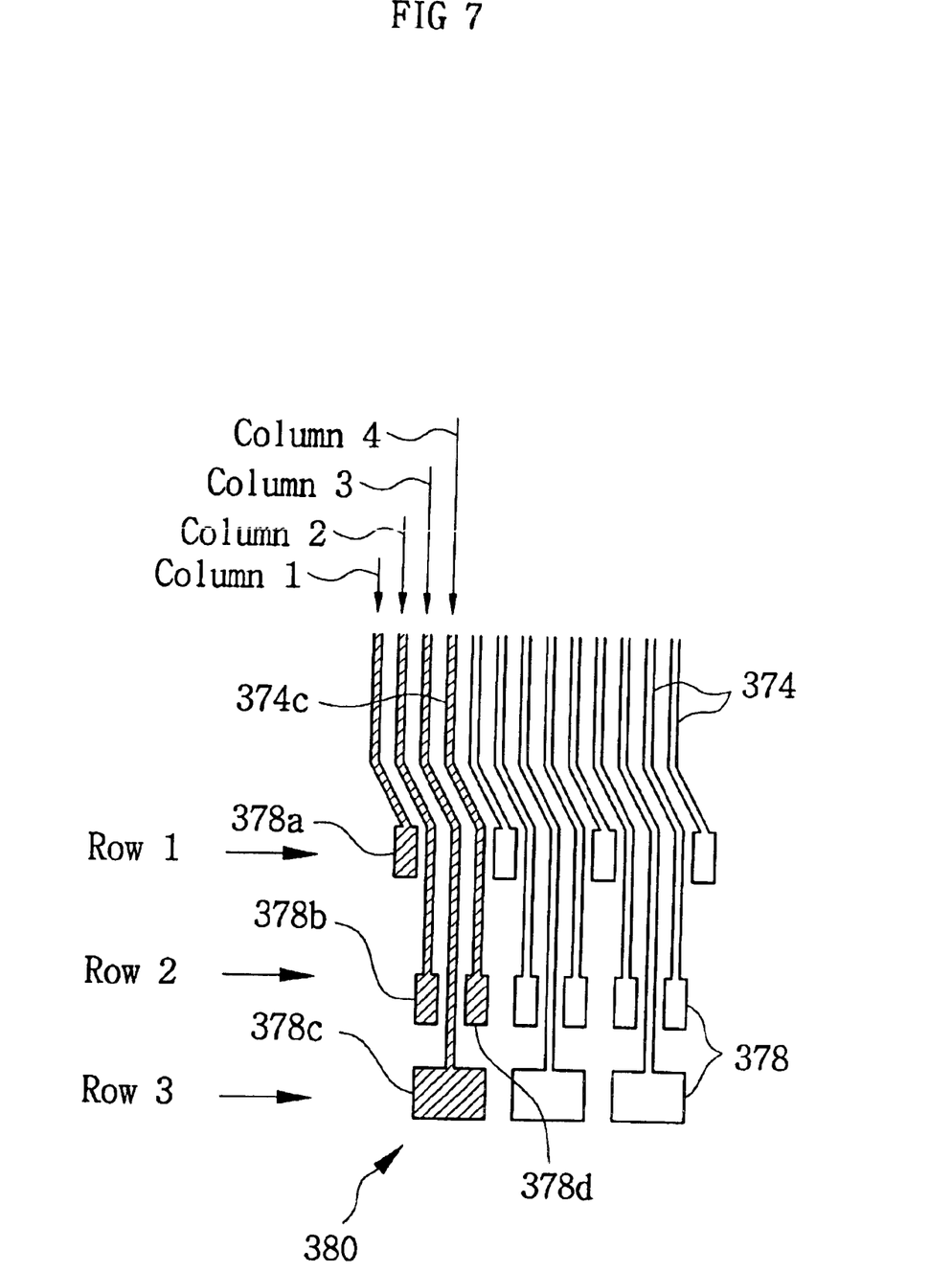
FIG. 7 is an enlarged plan view illustrating layout of output test pads of a TAB tape in accordance with another exemplary embodiment of the present invention.

Referring to FIG. 7, in accordance with another exemplary embodiment of the present invention, four output test pads 378a–378d form a group 380. A series of groups 380 may be consecutively arranged across the TAB tape 50. The four output test pads 378 comprising group 380 may be located at positions 1×1 (378a), 2×2 (378b), 3×3 (378c) and 4×2 (378d), respectively. The output test pads for the second column (378b) and the fourth column (378d) may be provided in the second row and may be arranged symmetrically about the output terminal pattern 374c connected to the output test pad for the third column (378c).

A TAB tape configured according to this embodiment may reduce the length of the test pad area by a row, compared with the test pad area OT1 provided by the conventional TAB tape 10 shown in FIGS. 1 and 2 for five output test pads. Further, output test pads 378a–378d may be formed at a maximum size allowed by the design rules while providing the required spacing between the output terminal patterns 374 and the output test pads 378.

Figure 8:
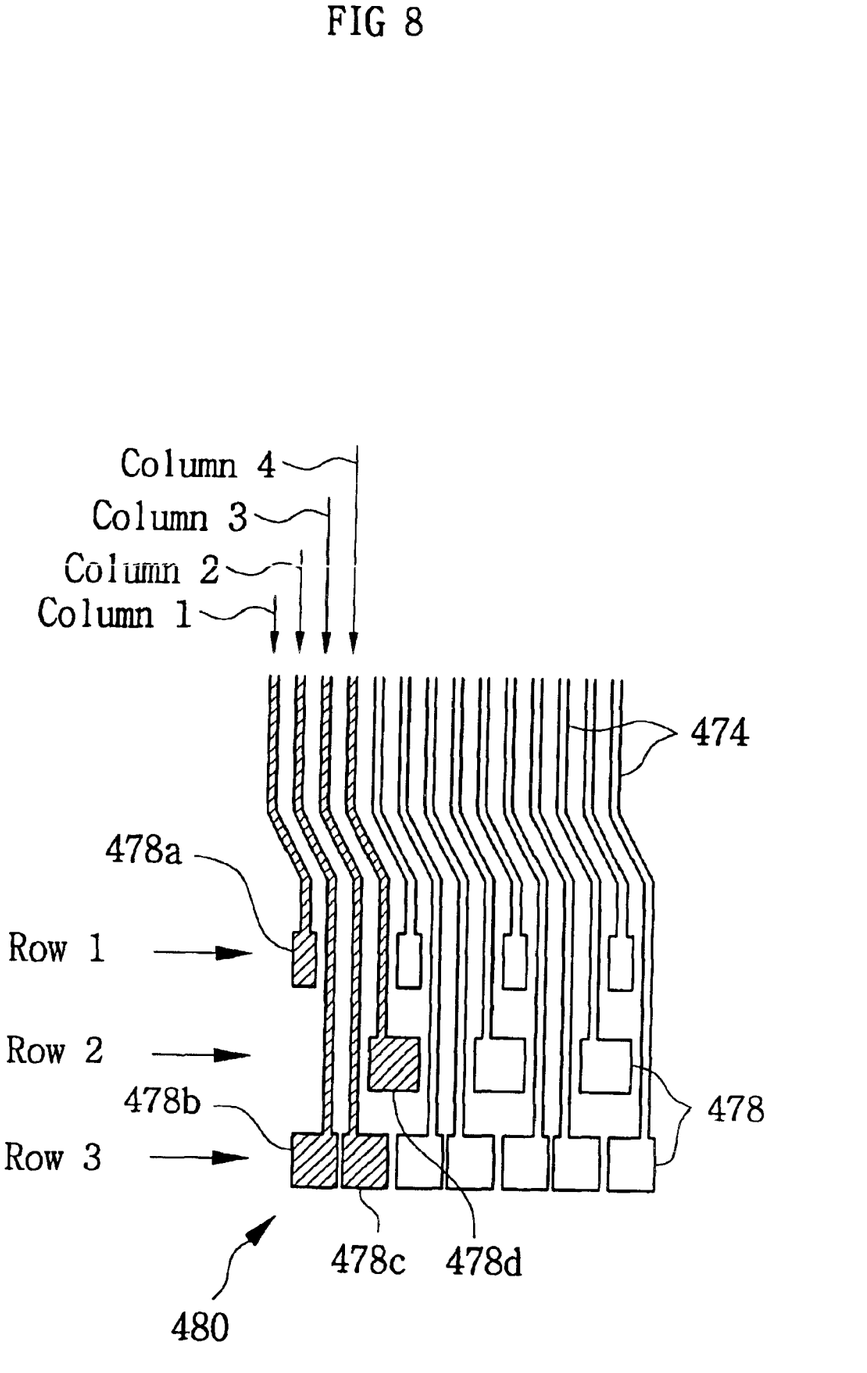
FIG. 8 is an enlarged plan view illustrating layout of output test pads of a TAB tape in accordance with another exemplary embodiment of the present invention.

Referring to FIG. 8, in accordance with another embodiment of the present invention, four output test pads 478a–478d form a group 480. A series of groups 480 may be consecutively arranged across TAB tape 50. The four output test pads 478 comprising group 480 may be located at positions 1×1 (478a), 2×3 (478b), 3×3 (478c) and 4×2 (478d), respectively. The output test pad for the second column (478b) may be located adjacent the output test pad for the third column (478c) in the third row.

A TAB tape configured according to this embodiment may reduce the length of the test pad area by a row, compared with the test pad area OT1 provided by conventional TAB tape 10 as shown in FIGS. 1 and 2 for a group of four output test pads. Test pads 478 may be formed at a maximum size allowed by the design rules while providing the required spacing between the output terminal patterns 474 and the test pads 478.

In accordance with the exemplary embodiments of the present invention, a sequence of n test pads may be arranged in rows form a group and may be provided on a TAB tape as a series of repeating groups consecutively arranged across the TAB tape. Further, within each group of test pads is at least one row having at least two test pads. Thus, by using this test pad configuration, the test pad area may be reduced when compared with a conventional configuration, which may lead to increased package yield per length of TAB tape and provide for the flexible layout of the test pad configuration.

Although the exemplary embodiments are generally described with respect to output test pads, as will be appreciated by one of ordinary skill, the teachings of the present invention may be applied to any type of pads, such as input, output or parametric test pads, and may be applied to more than one type of pad on a single TAB tape. Similarly, although the exemplary embodiments are generally described with respect to a single grouping, a plurality of different groupings of test pads could be used on a single TAB tape with the various groupings capable of being aligned in parallel, perpendicular, alternating or repeating configurations as may be desired. Further, although the exemplary embodiments are described with respect to a one-to-one correspondence between the pattern lines and the test pads, in certain configurations the correspondence may be different in one or more groupings.

Although various exemplary embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. A TAB tape for a semiconductor package, the TAB tape comprising:
    a base film having a chip mounting area for mounting at least one semiconductor chip; and
    a wiring pattern formed on the base film and associated with the chip mounting area, the wiring pattern comprising a plurality of output terminal patterns extending from the chip mounting area and a plurality of output test pads, one output test pad being connected to each output terminal pattern;
    wherein a selected number of the output test pads extending in a first direction from the chip mounting area arranged in a plurality of rows comprise a group, each group including at least two output test pads in a single row.

2. A TAB tape according to claim 1, wherein:
a plurality of groups are aligned in a repeating fashion along a portion of the base film.

3. A TAB tape according to claim 1, wherein:
the chip mounting area includes a window which penetrates the base film and exposes one end of each terminal pattern.

4. A TAB tape according to claim 1, wherein:
six test pads constitute a group and
further wherein
the six test pads are arranged in three rows,
    a first row including one test pad,
    a second row including two test pads, and
    a third row including three test pads.

5. A TAB tape according to claim 4, wherein:
each test pad in the group is connected to one of a series of six sequential output terminal patterns, and
further wherein
the first row includes the test pad connected to the third sequential output terminal pattern,
the second row includes the test pads connected to the second and fourth output terminal patterns, and
the third row includes the test pads connected to the first, fifth and sixth output terminal patterns.

6. A TAB tape according to claim 5, wherein:
the test pad connected to the second output terminal pattern is adjacent the test pad connected to the fourth output terminal pattern.

7. A TAB tape according to claim 6, wherein:
the test pads connected to the first, fifth and sixth output terminal patterns are adjacent one another.

8. A TAB tape according to claim 4, wherein:
wherein each of the six test pads are approximately the same size.

9. A TAB tape according to claim 1, wherein:
six test pads constitute a group and
further wherein
the six test pads are arranged in four rows,
    a first row including one test pad,
    a second row including one test pad,
    a third row including two test pads, and
    a fourth row including two test pads.

10. A TAB tape according to claim 9, wherein:
each test pad in the group is connected to one of a series of six sequential output terminal patterns, and
further wherein
the first row includes the test pad connected to the first sequential output terminal pattern,
the second row includes the test pad connected to the second output terminal pattern,
the third row includes the test pads connected to the third and sixth output terminal patterns, and
the fourth row includes the test pads connected to the fourth and fifth output terminal patterns.

11. A TAB tape according to claim 10, wherein:
wherein the test pads connected to the third and sixth output terminal patterns are arranged symmetrically about the fourth and fifth output terminal patterns.

12. A TAB tape according to claim 11, wherein:
the test pad connected to the fourth output terminal line is adjacent to the test pad connected to the fifth output terminal line.

13. A TAB tape according to claim 4, wherein:
each test pad in the group is connected to one of a series of six sequential output terminal patterns, and
further wherein
the first row includes the test pad connected to the second sequential output terminal pattern,
the second row includes the test pads connected to the first and third output terminal patterns, and
the third row includes the test pads connected to the fourth, fifth and sixth output terminal patterns.

14. A TAB tape according to claim 1, wherein:
five test pads comprise a group and
further wherein
the five test pads are arranged in three rows,
    a first row including one test pad,
    a second row including two test pads, and
    a third row including two test pads.

15. A TAB tape according to claim 14, wherein:
each test pad in the group is connected to one of a series of five sequential output terminal patterns, and
further wherein
the first row includes the test pad connected to the first sequential output terminal pattern,
the second row includes the test pads connected to the second and fifth output terminal patterns, and
the third row includes the test pads connected to the third and fourth output terminal patterns.

16. A TAB tape according to claim 15, wherein:
wherein the test pads connected to the second and fifth output terminal patterns are arranged symmetrically about the third and fourth output terminal patterns.

17. A TAB tape according to claim 16, wherein:
wherein the test pads connected to the third and fourth output terminal patterns are adjacent one another.

18. A TAB tape according to claim 1, wherein:
four test pads constitute a group and
further wherein
the four test pads are arranged in three rows,
    a first row including one test pad,
    a second row including two test pads, and
    a third row including one test pad.

19. A TAB tape according to claim 14, wherein:
each test pad in the group is connected to one of a series of four sequential output terminal patterns, and
further wherein the first row includes the test pad connected to the first sequential output terminal pattern, the second row includes the test pads connected to the second and fourth output terminal patterns, and the third row includes the test pad connected to the third output terminal pattern.

20. A TAB tape according to claim 19, wherein:

wherein the test pads connected to the second and fourth output terminal patterns are arranged symmetrically about the third output terminal pattern.

21. A TAB tape according to claim 14, wherein:

each test pad in the group is connected to one of a series of four sequential output terminal patterns, and further wherein the first row includes the test pad connected to the first sequential output terminal pattern, the second row includes the test pad connected to the fourth output terminal pattern, and the third row includes the test pads connected to the second and third output terminal patterns.

22. A TAB tape according to claim 21, wherein:

wherein the test pads connected to the second and third output terminal patterns are adjacent one another.

23. A TAB tape for a semiconductor package, the TAB tape comprising:

a base film having a chip mounting area for mounting at least one semiconductor chip; and a wiring pattern formed on the base film and associated with the chip mounting area, the wiring pattern including a plurality of test pads;

wherein a number N of the test pads extending in a first direction from the chip mounting area arranged in a number R of rows comprise a group G, and further wherein R and N are positive integers, N>R and R≧2.

24. A TAB tape for a semiconductor package according to claim 23, wherein:

the test pads include a plurality of output test pads, a number $N_o$ of the output test pads arranged in a number $R_o$ rows constituting a group $G_o$, wherein $N_o$ and $R_o$ are positive integers, $N_o>R_o$ and $R_o≧2$.

25. A TAB tape for a semiconductor package according to claim 24, wherein:

the test pads include a plurality of input test pads, a number $N_i$ of the input test pads arranged in a number $R_i$ rows constituting a group $G_i$, wherein $N_i$ and $R_i$ are positive integers, $N_i>R_i$ and $R_i≧2$.

26. A TAB tape for a semiconductor package according to claim 25, wherein:

$N_i \neq N_o$ and $R_i = R_o$.

27. A TAB tape for a semiconductor package according to claim 25, wherein:

$N_i \neq N_o$ and $R_i \neq R_o$.

28. A TAB tape for a semiconductor package according to claim 25, wherein:

$N_i = N_o$ and $R_i = R_o$.

29. A TAB tape for a semiconductor package according to claim 23, wherein:

a plurality of groups G are aligned in a repeating fashion along a portion of the base film.

30. A TAB tape for a semiconductor package according to claim 23, wherein:

a number $N_2$ of the test pads arranged in a number $R_2$ of rows comprise a second group $G_2$, and further wherein $R_2$ and $N_2$ are positive integers and $N_2>R_2$ and a plurality of groups G and a plurality of groups $G_2$ are aligned in a repeating fashion along a portion of the base film.

31. A TAB tape for a semiconductor package according to claim 30, wherein:

the groups G and the groups $G_2$ are aligned in an alternating fashion.

32. A TAB tape for a semiconductor package according to claim 30, wherein:

the groups G are aligned and the groups $G_2$ are aligned.

33. A TAB tape for a semiconductor package according to claim 32, wherein:

the aligned groups G are arranged parallel to the aligned groups $G_2$.

34. A TAB tape for a semiconductor package according to claim 32, wherein:

the aligned groups G are arranged perpendicular to the aligned groups $G_2$.

35. A TAB tape for a semiconductor package according to claim 30, wherein:

$N=N_2$.

36. A TAB tape for a semiconductor package according to claim 35, wherein:

$R=R_2$.

* * * * *